United States Patent
Hall et al.

(10) Patent No.: US 7,416,913 B2
(45) Date of Patent: Aug. 26, 2008

(54) METHODS OF MANUFACTURING MICROELECTRONIC IMAGING UNITS WITH DISCRETE STANDOFFS

(75) Inventors: Frank L. Hall, Boise, ID (US); William J. Reeder, Boise, ID (US); Bret K. Street, Meridian, ID (US); James M. Derderian, Boise, ID (US)

(73) Assignee: Micron Technology, Inc., Boise, ID (US)

(*) Notice: Subject to any disclaimer, the term of this patent is extended or adjusted under 35 U.S.C. 154(b) by 286 days.

(21) Appl. No.: 10/893,022

(22) Filed: Jul. 16, 2004

(65) Prior Publication Data
US 2006/0014313 A1 Jan. 19, 2006

(51) Int. Cl.
*H01L 21/00* (2006.01)
(52) U.S. Cl. ........... 438/64; 257/E23.128; 257/E23.116
(58) Field of Classification Search ................ 438/64; 257/E23.128, E23.116
See application file for complete search history.

(56) References Cited

U.S. PATENT DOCUMENTS

| | | | |
|---|---|---|---|
| 3,345,134 A | 10/1967 | Heymer et al. |
| 4,534,100 A | 8/1985 | Lane |
| 4,906,314 A | 3/1990 | Farnworth et al. |
| 5,130,783 A | 7/1992 | McLellan |
| 5,371,397 A | 12/1994 | Maegawa et al. |
| 5,424,573 A | 6/1995 | Kato et al. |
| 5,435,887 A | 7/1995 | Rothschild et al. |
| 5,505,804 A | 4/1996 | Mizuguchi et al. |
| 5,593,913 A | 1/1997 | Aoki |
| 5,605,783 A | 2/1997 | Revelli et al. |
| 5,672,519 A | 9/1997 | Song et al. |
| 5,694,246 A | 12/1997 | Aoyama et al. |
| 5,708,293 A | 1/1998 | Ochi et al. |
| 5,771,158 A | 6/1998 | Yamagishi et al. |
| 5,776,824 A | 7/1998 | Farnworth et al. |
| 5,811,799 A | 9/1998 | Wu |
| 5,821,532 A | 10/1998 | Beaman et al. |

(Continued)

FOREIGN PATENT DOCUMENTS

EP 0 886 323 12/1998

(Continued)

OTHER PUBLICATIONS

U.S. Appl. No. 10/785,466, Kirby.

(Continued)

*Primary Examiner*—Bradley K Smith
(74) *Attorney, Agent, or Firm*—Dickstein Shapiro LLP

(57) ABSTRACT

Microelectronic imaging units and methods for manufacturing microelectronic imaging units are disclosed herein. In one embodiment, a method includes placing a plurality of singulated imaging dies on a support member. The individual imaging dies include an image sensor, an integrated circuit operably coupled to the image sensor, and a plurality of external contacts operably coupled to the integrated circuit. The method further includes disposing a plurality of discrete stand-offs on the support member. The discrete stand-offs are arranged in arrays relative to corresponding imaging dies. The method further includes electrically connecting the external contacts of the imaging dies to corresponding terminals on the support member, and attaching a plurality of covers to corresponding stand-off arrays so that the covers are positioned over the image sensors.

44 Claims, 6 Drawing Sheets

U.S. PATENT DOCUMENTS

| | | | |
|---|---|---|---|
| 5,857,963 A | 1/1999 | Pelchy et al. |
| 5,861,654 A | 1/1999 | Johnson |
| 5,877,040 A | 3/1999 | Park et al. |
| 5,897,338 A | 4/1999 | Kaldenberg |
| 5,914,488 A | 6/1999 | Sone |
| 5,977,535 A | 11/1999 | Rostoker |
| 5,998,862 A | 12/1999 | Yamanaka |
| 6,080,291 A | 6/2000 | Woodruff et al. |
| 6,104,086 A | 8/2000 | Ichikawa et al. |
| 6,114,240 A | 9/2000 | Akram et al. |
| 6,143,588 A | 11/2000 | Glenn |
| 6,236,046 B1 | 5/2001 | Watabe et al. |
| 6,259,083 B1 | 7/2001 | Kimura |
| 6,266,197 B1 | 7/2001 | Glenn et al. |
| 6,274,927 B1 | 8/2001 | Glenn |
| 6,285,064 B1 | 9/2001 | Foster |
| 6,351,027 B1 | 2/2002 | Giboney et al. |
| 6,372,548 B2 | 4/2002 | Bessho et al. |
| 6,407,381 B1 | 6/2002 | Glenn et al. |
| 6,411,439 B2 | 6/2002 | Nishikawa |
| 6,483,652 B2 | 11/2002 | Nakamura |
| 6,503,780 B1 | 1/2003 | Glenn et al. |
| 6,541,762 B2 | 4/2003 | Knag et al. |
| 6,560,047 B2 | 5/2003 | Choi et al. |
| 6,566,745 B1 | 5/2003 | Beyne et al. |
| 6,603,183 B1 | 8/2003 | Hoffman |
| 6,617,623 B2 | 9/2003 | Rhodes |
| 6,661,047 B2 | 12/2003 | Rhodes |
| 6,667,551 B2 | 12/2003 | Hanaoka et al. |
| 6,670,986 B1 | 12/2003 | Ben Shoshan et al. |
| 6,686,588 B1 | 2/2004 | Webster et al. |
| 6,703,310 B2 | 3/2004 | Mashino et al. |
| 6,864,172 B2 | 4/2004 | Noma et al. |
| 6,734,419 B1 | 5/2004 | Glenn et al. |
| 6,759,266 B1 | 7/2004 | Hoffman |
| 6,767,753 B2 * | 7/2004 | Huang ......................... 438/25 |
| 6,774,486 B2 | 8/2004 | Kinsman |
| 6,778,046 B2 | 8/2004 | Stafford et al. |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,813,154 B2 | 11/2004 | Diaz et al. |
| 6,825,458 B1 | 11/2004 | Moess et al. |
| 6,828,663 B2 | 12/2004 | Chen et al. |
| 6,828,674 B2 | 12/2004 | Karpman |
| 6,844,978 B2 | 1/2005 | Harden et al. |
| 6,882,021 B2 | 4/2005 | Boon et al. |
| 6,885,107 B2 | 4/2005 | Kinsman |
| 6,934,065 B2 | 8/2005 | Kinsman |
| 6,946,325 B2 | 9/2005 | Yean et al. |
| 7,122,390 B2 * | 10/2006 | Kinsman ..................... 438/26 |
| 2002/0006687 A1 | 1/2002 | Lam |
| 2002/0057468 A1 | 5/2002 | Segawa et al. |
| 2002/0089025 A1 | 7/2002 | Chou |
| 2002/0096729 A1 | 7/2002 | Tu et al. |
| 2002/0113296 A1 | 8/2002 | Cho et al. |
| 2002/0145676 A1 | 10/2002 | Kuno et al. |
| 2003/0062601 A1 | 4/2003 | Harnden et al. |
| 2004/0012698 A1 | 1/2004 | Suda et al. |
| 2004/0023469 A1 | 2/2004 | Suda |
| 2004/0038442 A1 * | 2/2004 | Kinsman ..................... 438/64 |
| 2004/0041261 A1 | 3/2004 | Kinsman |
| 2004/0082094 A1 | 4/2004 | Yamamoto |
| 2004/0113221 A1 * | 6/2004 | Hsieh et al. ................. 257/433 |
| 2004/0214373 A1 | 10/2004 | Jiang et al. |
| 2004/0245649 A1 | 12/2004 | Imaoka |
| 2005/0052751 A1 | 3/2005 | Liu et al. |
| 2005/0104228 A1 | 5/2005 | Rigg et al. |
| 2005/0110889 A1 | 5/2005 | Tuttle et al. |
| 2005/0127478 A1 | 6/2005 | Hiatt et al. |
| 2005/0151228 A1 | 7/2005 | Tanida et al. |
| 2005/0236708 A1 | 10/2005 | Farnworth et al. |
| 2005/0254133 A1 | 11/2005 | Akram et al. |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/894,262, Farnworth et al.
U.S. Appl. No. 10/910,491, Bolken et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Blackburn, J.M. et al., "Deposition of Conformal Copper and Nickel Films from Supercritical Carbon Dioxide," Science, vol. 294, pp. 141-145, Oct. 5, 2001.
Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.
Edmund Industrial Optics, Mounted IR Filters, 1 page, retrieved from the Internet on Jun. 30, 2003, <http://www.edmundoptics.com>.
Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.
Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Mackaging and Assembly of Micromachined Sensors," Final Report 1998-1999 for Micro Project 98-144, 3 pages, Department of Electrical & Computer Engineering, University of California, Davis.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., COMS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

U.S. Appl. No. 10/927,550, filed Aug. 26, 2004, Derderian et al.
U.S. Appl. No. 10/915,180, filed Aug. 10, 2004, Street et al.
U.S. Appl. No. 10/901,851, filed Jul. 28, 2004, Derderian et al.

Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

DuPont Electronic Materials, Data Sheet, Pyralux PC 2000 Flexible Composites, 4 pages, Oct. 1998, <http://www.dupont.com/fcm>.

Micro Chem, Nano SU-8, Negative Tone Photoresist Formulations 50-100, 4 pages, Feb. 2002, <http://www.microchem.com/products/pdf/SU8_50-100.pdf>.

* cited by examiner

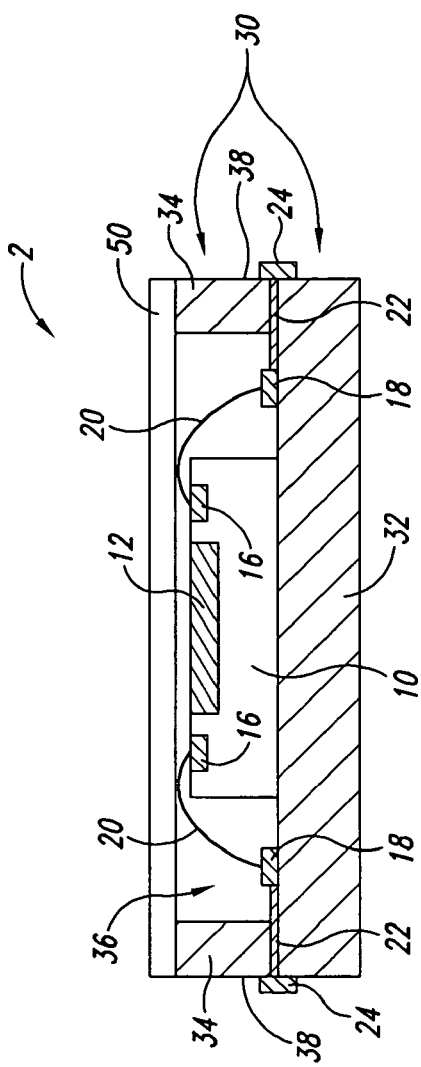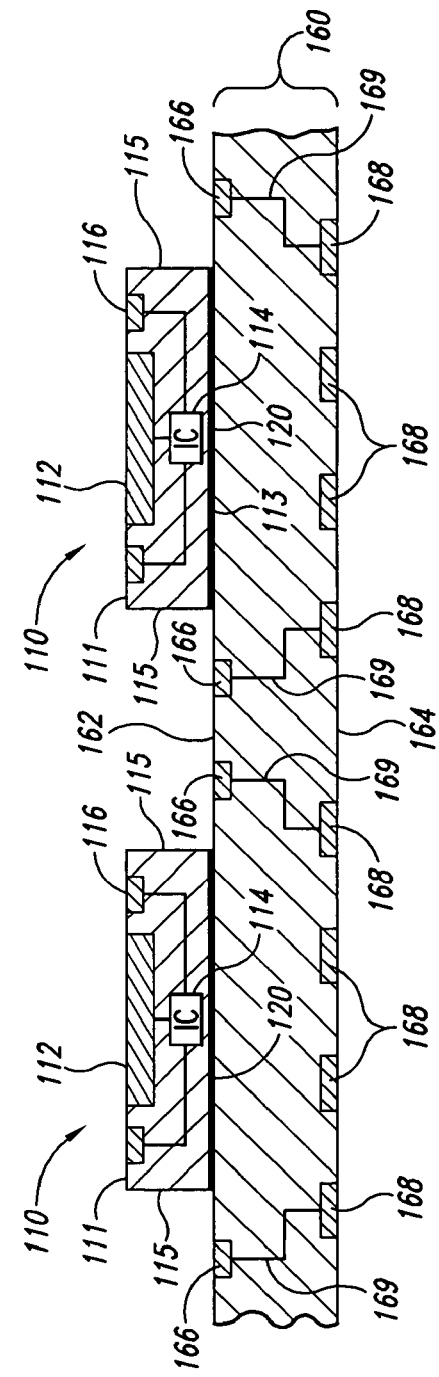
Fig. 1 (Prior Art)
Fig. 2

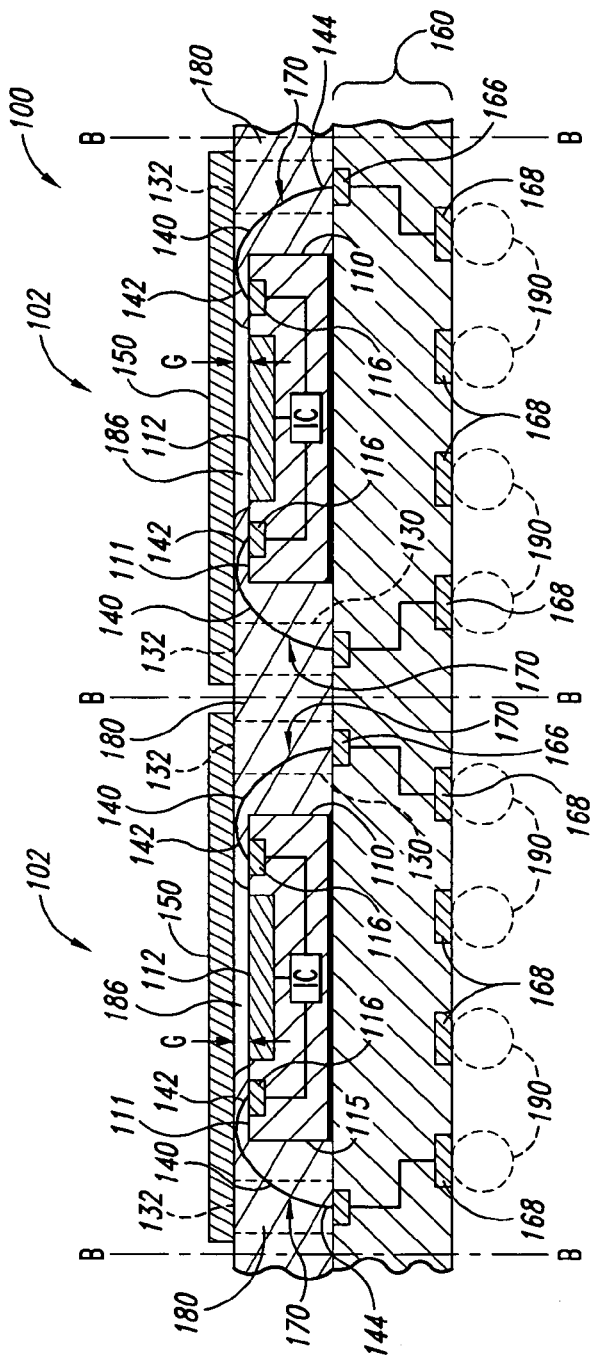
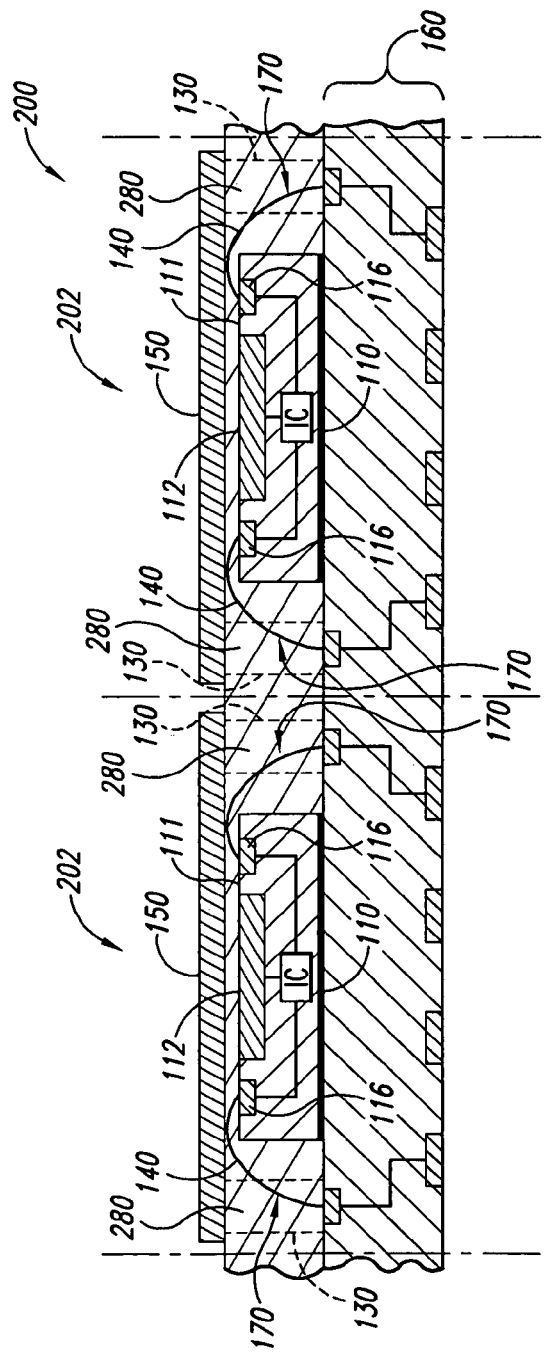
Fig. 5
Fig. 6

continually being made smaller in order to be more portable. Therefore, there is a need to provide microelectronic imaging units with smaller footprints.

METHODS OF MANUFACTURING MICROELECTRONIC IMAGING UNITS WITH DISCRETE STANDOFFS

TECHNICAL FIELD

The present invention is related to microelectronic imaging units having solid state image sensors and methods for manufacturing such imaging units.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect their delicate components and to provide external electrical contacts.

FIG. 1 is a schematic side cross-sectional view of a conventional microelectronic imaging unit 2 including an imaging die 10, a chip carrier 30 carrying the die 10, and a cover 50 attached to the carrier 30 over the die 10. The imaging die 10 includes an image sensor 12 and a plurality of bond-pads 16 operably coupled to the image sensor 12. The chip carrier 30 has a base 32, sidewalls 34 projecting from the base 32, and a recess 36 defined by the base 32 and sidewalls 34. The die 10 is accordingly sized to be received within the recess 36 and attached to the base 32. The chip carrier 30 further includes an array of terminals 18 on the base 32, an array of contacts 24 on an external surface 38, and a plurality of traces 22 electrically connecting the terminals 18 to corresponding external contacts 24. The terminals 18 are positioned between the die 10 and the sidewalls 34 so that wire-bonds 20 can electrically couple the terminals 18 to the corresponding bond-pads 16 on the die 10.

One problem with the microelectronic imaging unit 2 illustrated in FIG. 1 is that the die 10 must be sized and configured to fit within the recess 36 of the chip carrier 30. A die having a different shape and/or size requires a different chip carrier. As such, manufacturing imaging units with dies having different sizes requires fabricating various configurations of chip carriers and significantly retooling the manufacturing process.

Another problem with conventional microelectronic imaging units is that they have relatively large footprints. For example, the footprint of the imaging unit 2 in FIG. 1 is the surface area of the base 32 of the chip carrier 30, which is significantly larger than the surface area of the die 10. Accordingly, the footprint of conventional microelectronic imaging units can be a limiting factor in the design and marketability of picture cell phones or PDAs because these devices are

BRIEF DESCRIPTION OF THE DRAWINGS

FIG. 1 is a schematic side cross-sectional view of a conventional microelectronic imaging unit in accordance with the prior art.

FIGS. 2-5 illustrate stages in one embodiment of a method for manufacturing a plurality of microelectronic imaging units in accordance with the invention.

FIG. 2 is a schematic side cross-sectional view of an assembly including a plurality of imaging dies arranged in an array on a support member.

FIG. 4 is a schematic side cross-sectional view of the assembly after attaching a plurality of covers to corresponding arrays of stand-offs.

FIG. 5 is a schematic side cross-sectional view of the assembly after disposing a flowable material around the perimeter of the individual imaging dies.

FIG. 6 is a schematic side cross-sectional view of an assembly including a plurality of imaging units in accordance with another embodiment of the invention.

DETAILED DESCRIPTION

A. Overview

Figure 3A:
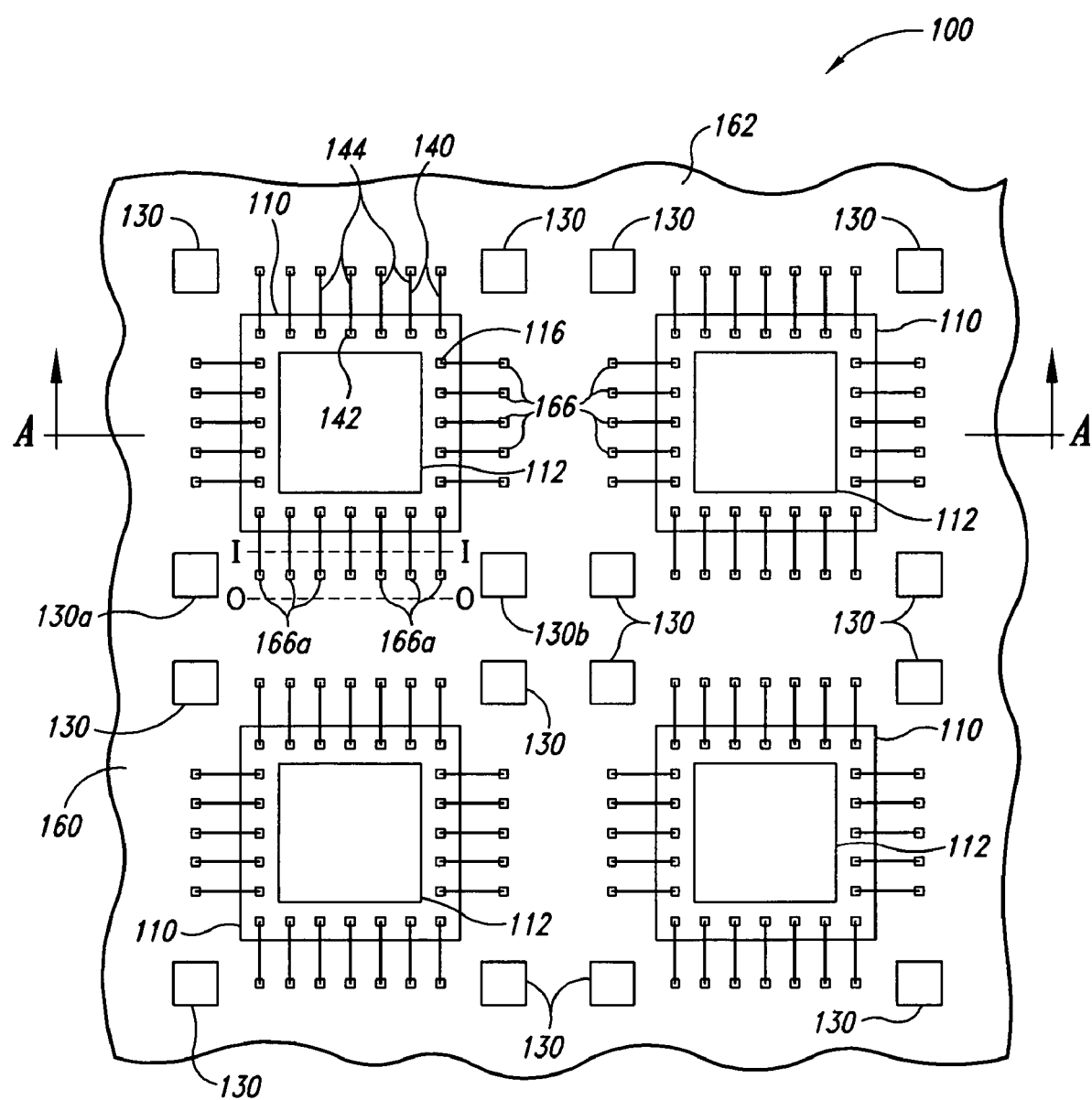
FIG. 3A is a schematic top plan view of the assembly after forming a plurality of discrete stand-offs on the support member.

The following disclosure describes several embodiments of methods for manufacturing microelectronic imaging units and microelectronic imaging units that are formed using such methods. One aspect of the invention is directed toward methods for manufacturing a plurality of microelectronic imaging units. An embodiment of one such method includes placing a plurality of singulated imaging dies on a support member. The individual imaging dies include an image sensor, an integrated circuit operably coupled to the image sensor, and a plurality of external contacts operably coupled to the integrated circuit. The method further includes disposing a plurality of discrete stand-offs on the support member. The discrete stand-offs are arranged in arrays relative to corresponding imaging dies. The method further includes electrically connecting the external contacts of the imaging dies to corresponding terminals on the support member and attaching a plurality of covers to corresponding stand-off arrays so that the covers are positioned over the image sensors. The stand-offs in the individual arrays can be spaced apart so that adjacent stand-offs define openings between the cover and the support member. The method can further include flowing an underfill material into the openings between adjacent stand-offs.

Another aspect of the invention is directed toward methods for manufacturing a microelectronic imaging unit. In one embodiment, a method includes coupling an imaging die to a support member having a plurality of terminals. The imaging die includes an image sensor, an integrated circuit operably coupled to the image sensor, and a plurality of external contacts operably coupled to the integrated circuit. The method further includes disposing a plurality of stand-offs on the support member so that at least some of the terminals of the support member are positioned outboard and/or directly between adjacent stand-offs. The method further includes electrically connecting the external contacts of the imaging die to corresponding terminals on the support member and attaching a cover to the stand-offs with the cover over the image sensor.

Another aspect of the invention is directed toward a microelectronic imaging unit. One embodiment of such an imaging unit includes a support member, an imaging die attached to the support member, and a plurality of stand-offs on the support member. The imaging die includes an image sensor, an integrated circuit operably coupled to the image sensor, and a plurality of external contacts operably coupled to the integrated circuit. The individual stand-offs are spaced apart from each other on the support member so that adjacent stand-offs define an opening. The imaging unit further includes a cover positioned over the image sensor and a flowable material disposed in the openings between the stand-offs.

Specific details of several embodiments of the invention are described below with reference to CMOS imaging units to provide a thorough understanding of these embodiments, but other embodiments can use CCD imaging units or other types of solid state imaging devices. Several details describing structures or processes that are well known and often associated with other types of microelectronic devices are not set forth in the following description for purposes of brevity. Moreover, although the following disclosure sets forth several embodiments of different aspects of the invention, several other embodiments of the invention can have different configurations or different components than those described in this section. As such, it should be understood that the invention may have other embodiments with additional elements or without several of the elements described below with reference to FIGS. 2-8;

B. Embodiments of Methods for Manufacturing Microelectronic Imaging Units

FIGS. 2-5 illustrate stages in one embodiment of a method for manufacturing a plurality of microelectronic imaging units. For example, FIG. 2 is a schematic side cross-sectional view of an assembly 100 including a plurality of microelectronic imaging dies 110 (only two are shown) arranged in an array on a support member 160. The imaging dies 110 include a first side 111, a second side 113 opposite the first side 111, and a plurality of ends 115 connecting the first side 111 to the second side 113. The second side 113 of the dies 110 is attached to the support member 160 with an adhesive 120, such as an adhesive film, epoxy, or other suitable material.

The imaging dies 110 further include an image sensor 112 on the first side 111, an integrated circuit 114 (shown schematically) operably coupled to the image sensor 112, and a plurality of external contacts 116 (e.g., bond-pads) operably coupled to the integrated circuit 114. The image sensors 112 can be CMOS devices or CCD image sensors for capturing pictures or other images in the visible spectrum. The image sensors 112 may also detect radiation in other spectrums (e.g., IR or UV ranges). In the illustrated embodiment, the imaging dies 110 on the support member 160 have the same structure; however, in several embodiments, the imaging dies 110 on the support member can have different features to perform different functions.

The support member 160 can be a lead frame or a substrate, such as a printed circuit board, for carrying the imaging dies 110. In the illustrated embodiment, the support member 160 includes a first side 162 having a plurality of terminals 166 and a second side 164 having a plurality of pads 168. The terminals 166 can be arranged in arrays for attachment to corresponding external contacts 116 on the dies 110, and the pads 168 can be arranged in arrays for attachment to a plurality of conductive couplers (e.g., solder balls). The support member 160 further includes a plurality of conductive traces 169 electrically coupling the terminals 166 to corresponding pads 168.

FIG. 3A is a schematic top plan view of the assembly 100 after forming a plurality of discrete stand-offs 130 on the first side 162 of the support member 160. The stand-offs 130 are arranged in arrays around the perimeter of corresponding imaging dies 110. For example, in the illustrated embodiment, each array includes four stand-offs 130 positioned proximate to the corners of the corresponding imaging die 110. In other embodiments, such as the embodiment described below with reference to FIG. 8, the stand-offs can be arranged in arrays with other configurations.

In one aspect of the illustrated embodiment, the stand-offs 130 are arranged such that the terminals 166 on the support member 160 are positioned outboard and/or directly between adjacent stand-offs 130. For example, a first stand-off 130a and a second stand-off 130b are arranged on the support member 160 so that a group of terminals 166a are positioned directly between the first and second stand-offs 130a-b. Alternatively, the first and second stand-offs 130a-b and/or the terminals 166a can be arranged such that one or more of the terminals 166a are positioned outboard the first and second stand-offs 130a-b (see, e.g., line O-O shown in phantom). In either case, the terminals 166a are not positioned inboard the first and second stand-offs 130a-b in some embodiments. However, in other embodiments, the stand-offs 130 can be arranged such that some but not all of the terminals 166 are inboard the adjacent stand-offs 130 (see, e.g., line I-I shown in phantom).

Figure 3B:
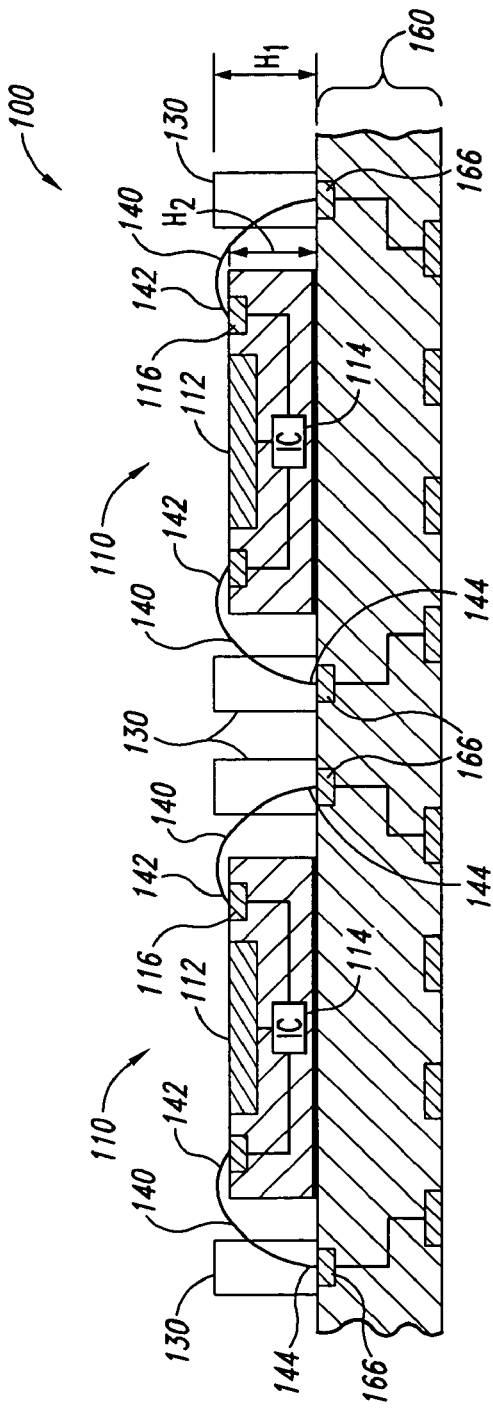
FIG. 3B is a schematic side cross-sectional view of the assembly taken substantially along the line A-A of FIG. 3A.

FIG. 3B is a schematic side cross-sectional view of the assembly 100 taken substantially along the line A-A of FIG. 3A. The stand-offs 130 are constructed to have a predetermined height $H_1$ for supporting covers at a precise distance over the image sensors 112. As such, the predetermined height $H_1$ of the stand-offs 130 can be greater than a height $H_2$ of the imaging dies 110. Moreover, the stand-offs 130 can be made of epoxy and/or other dimensionally stable materials so that their height $H_1$ remains generally constant during use.

The stand-offs 130 can be formed on the support member 160 by deposition processes, three-dimensional stereolithography processes, molding, or other suitable methods. Alternatively, the stand-offs 130 can be formed separate from the support member 160 and then attached to the support member 160 with an adhesive. In several embodiments, the stand-offs 130 can be an integral portion of the support member 160.

Referring to both FIGS. 3A and 3B, after attaching the imaging dies 110 to the support member 160, the contacts 116 on the imaging dies 110 are wire-bonded to corresponding terminals 166 on the support member 160. The imaging dies 110 can be wire-bonded to the support member 160 before or after the stand-offs 130 are disposed on the support member 160. The individual wire-bonds 140 include a proximate portion 142 attached to the contact 116 and a distal portion 144 attached to the terminal 166. Because the terminals 166 in the illustrated embodiment are positioned directly between adjacent stand-offs 130, the distal portions 144 of the wire-bonds 140 in this embodiment are also positioned directly between adjacent stand-offs 130.

Figure 4:
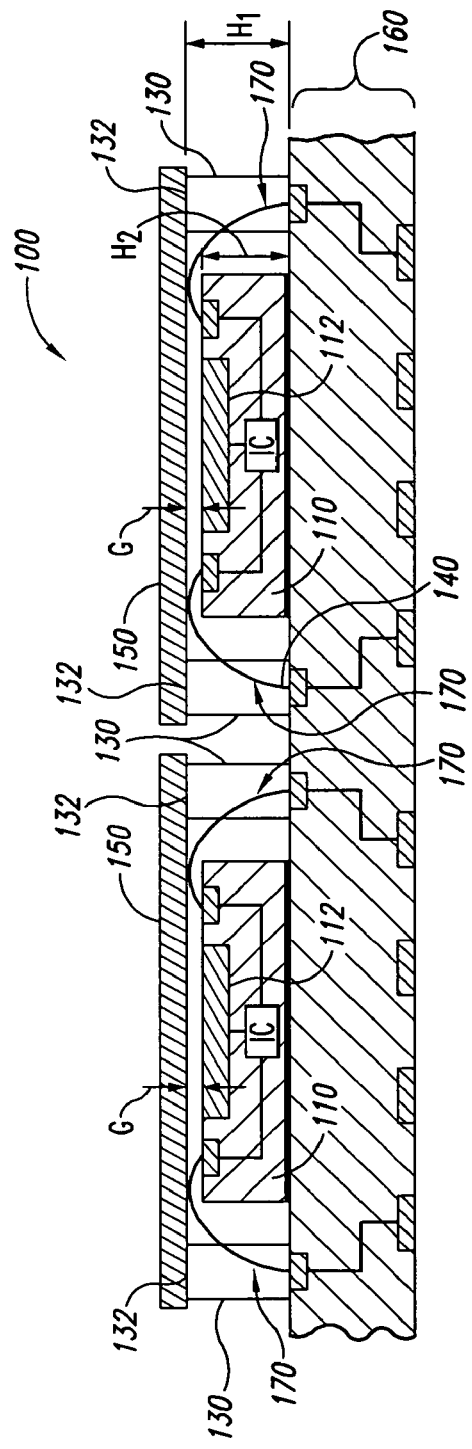

FIG. 4 is a schematic side cross-sectional view of the assembly 100 after attaching a plurality of covers 150 to corresponding arrays of stand-offs 130. The individual covers 150 are supported by an array of stand-offs 130 and positioned over the corresponding image sensors 112. The individual covers 150 are spaced apart from the image sensors 112 by a predetermined and precise distance G, which can correspond to the difference between the height $H_1$ of the stand-offs 130 and the height $H_2$ of the imaging die 110. The covers 150 can be glass, quartz, or another suitable material that is transmissive to the desired spectrum of radiation. The covers 150, for example, can further include one or more anti-reflective films and/or filters.

Although in the illustrated embodiment the stand-offs 130 have a generally flat top surface 132 to support the cover 150, in other embodiments, the top surface 132 can include reference and/or alignment features to further align the cover 150 relative to the image sensor 112. Additionally, the individual covers 150 can be positioned over corresponding dies 110 as shown in FIG. 4, or the cover can be a single pane covering multiple dies 110. In several embodiments, the stand-offs 130 can be an integral portion of the covers 150. In any of these embodiments, adjacent stand-offs 130 in individual arrays define openings 170 between the cover 150 and the support member 160.

FIG. 5 is a schematic side cross-sectional view of the assembly 100 after disposing a flowable material 180 around the perimeter of the individual imaging dies 110. The flowable material 180 can be dispensed onto the support member 160 via a gap between adjacent covers 150 and/or between the covers 150 and the support member 160 at the perimeter of the support member 160. The flowable material 180 wicks into and through the openings 170 toward the imaging dies 110. In the illustrated embodiment, the flowable material 180 encapsulates and covers the ends 115 and an outer perimeter portion of the first side 111 of the dies 110. As such, the assembly 100 can have cells 186 filled with air or another gas between the covers 150 and the dies 110 over the image sensors 112. Air cells 186 can be useful in applications in which the image sensors 112 include microlenses. In other embodiments, such as the embodiment described below with reference to FIG. 6, the flowable material 180 can extend across the first side 111 of the imaging dies 110 and cover the image sensors 112.

In the embodiment shown in FIG. 5, the flowable material 180 can be an opaque or transparent underfill material that enhances the integrity of the joint between the individual covers 150 and the support member 160. Moreover, the flowable material 180 can protect the components from moisture, chemicals, and other contaminants. In embodiments in which the flowable material 180 is an underfill material, the underfill material can include filler particles selected to (a) increase the rigidity of the material, (b) modify the coefficient of thermal expansion of the material, and/or (c) alter the viscosity of the material. Suitable underfill materials include epoxy and other similar materials, such as those made by Henkel Loctite Corporation of Rocky Hill, Conn., and Nagase America Corporation of New York, N.Y.

After depositing the flowable material 180, the assembly 100 can be heated to at least partially cure the flowable material 180. Moreover, a plurality of conductive couplers 190 (shown in hidden lines) can be formed on corresponding pads 168 of the support member 160. After curing the flowable material 180, the assembly 100 can be cut along lines B-B by scribing, sawing, or another suitable process to singulate the individual imaging units 102. Alternatively, the imaging units 102 can be singulated before the flowable material 180 is deposited between the covers 150 and the support member 160.

One feature of several embodiments of the imaging units 102 illustrated in FIG. 5 is that the distal portion 144 of the wire-bonds 140 and the terminals 166 on the support member 160 are positioned directly between adjacent stand-offs 130. An advantage of this feature is that the footprint of the individual imaging units 102 is smaller than the footprint of conventional imaging units. The reduced footprint of the imaging units 102 is particularly advantageous for picture cell phones, PDAs, or other applications where space is limited. In prior art devices, such as the imaging unit 2 illustrated in FIG. 1, the terminals 18 and the wire-bonds 20 are inboard the sidewalls 34 of the chip carrier 30, which increases the footprint of the imaging unit 2.

One feature of the method for manufacturing imaging units 102 illustrated in FIGS. 2-5 is that the support member 160 can carry imaging dies 110 with different sizes and/or configurations. An advantage of this feature is that the method can be easily adapted to handle various configurations of imaging dies without significant changes to the fabrication process. Prior art methods, such as the method required to form the imaging unit 2 described above with reference to FIG. 1, may require significant retooling because the chip carriers 30 can only carry imaging dies 10 with a certain shape and size.

Another advantage of the method for manufacturing imaging units 102 illustrated in FIGS. 2-5 is that the method is expected to significantly enhance the efficiency of the manufacturing process because a plurality of imaging units 102 can be fabricated simultaneously using highly accurate and efficient processes developed for packaging and manufacturing semiconductor devices. This method of manufacturing imaging units 102 is also expected to enhance the quality and performance of the imaging units 102 because the semiconductor fabrication processes can reliably produce and assemble the various components with a high degree of precision. As such, several embodiments of the method are expected to significantly reduce the cost for assembling microelectronic imaging units 102, increase the performance of the imaging units 102, and produce higher quality imaging units 102.

C. Additional Embodiments of Microelectronic Imaging Units

FIG. 6 is a schematic side cross-sectional view of an assembly 200 including a plurality of microelectronic imaging units 202 in accordance with another embodiment of the invention. The microelectronic imaging units 202 are generally similar to the microelectronic imaging units 102 described above with reference to FIG. 5. However, unlike the imaging units 102 described above, the illustrated imaging units 202 shown in FIG. 6 include a flowable material 280 disposed completely across the first side 111 of the imaging dies 110. As such, the flowable material 280 covers the image sensors 112 and fills the volume between the covers 150 and the imaging dies 110. The flowable material 280 can be an optical grade underfill material with a high transparency to eliminate or reduce light scattering and/or the loss of images. In applications in which the image sensors 112 have pixels with a smaller size, the flowable material 280 can have a higher refractive index to assist in focusing the light for the pixels.

One feature of the imaging units 202 illustrated in FIG. 6 is that the flowable material 280 can be dimensionally stable over a wide range of temperatures. An advantage of this feature is that the distance between the cover 150 and the image sensor 112 remains generally consistent, even if the imaging units 202 operate in an environment that experiences significant changes in ambient temperature. If a temperature change were to cause the medium between the cover 150 and the image sensor 112 to expand or contract, the associated change in the distance between the cover 150 and the image sensor 112 could skew the image and reduce the life of the imaging unit 202 due to fatigue.

Figure 7:
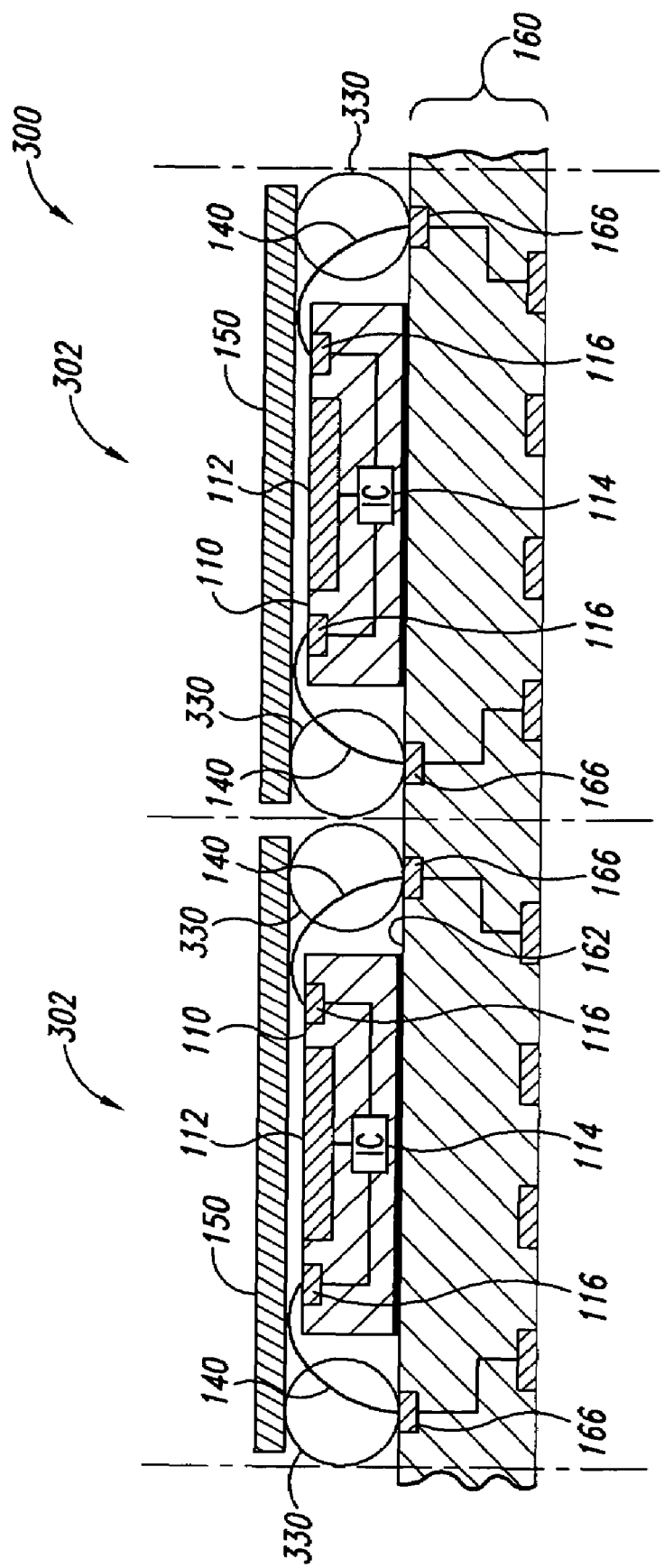
FIG. 7 is a schematic side cross-sectional view of an assembly including a plurality of imaging units in accordance with another embodiment of the invention.

FIG. 7 is a schematic side cross-sectional view of an assembly 300 including a plurality of imaging units 302 in accordance with another embodiment of the invention. The illustrated imaging units 302 are generally similar to the imaging units 102 described above with reference to FIG. 5. The illustrated imaging units 302, however, include a plurality of generally spherical stand-offs 330 arranged in arrays relative to corresponding imaging dies 110. To form the illustrated stand-offs 330, a precise volume of material can be dispensed onto the first side 162 of the support member 160 so that the stand-offs 330 support the covers 150 at a desired height. In additional embodiments, the stand-offs 330 can have other shapes and/or configurations for supporting the covers 150 at the precise predetermined height.

Figure 8:
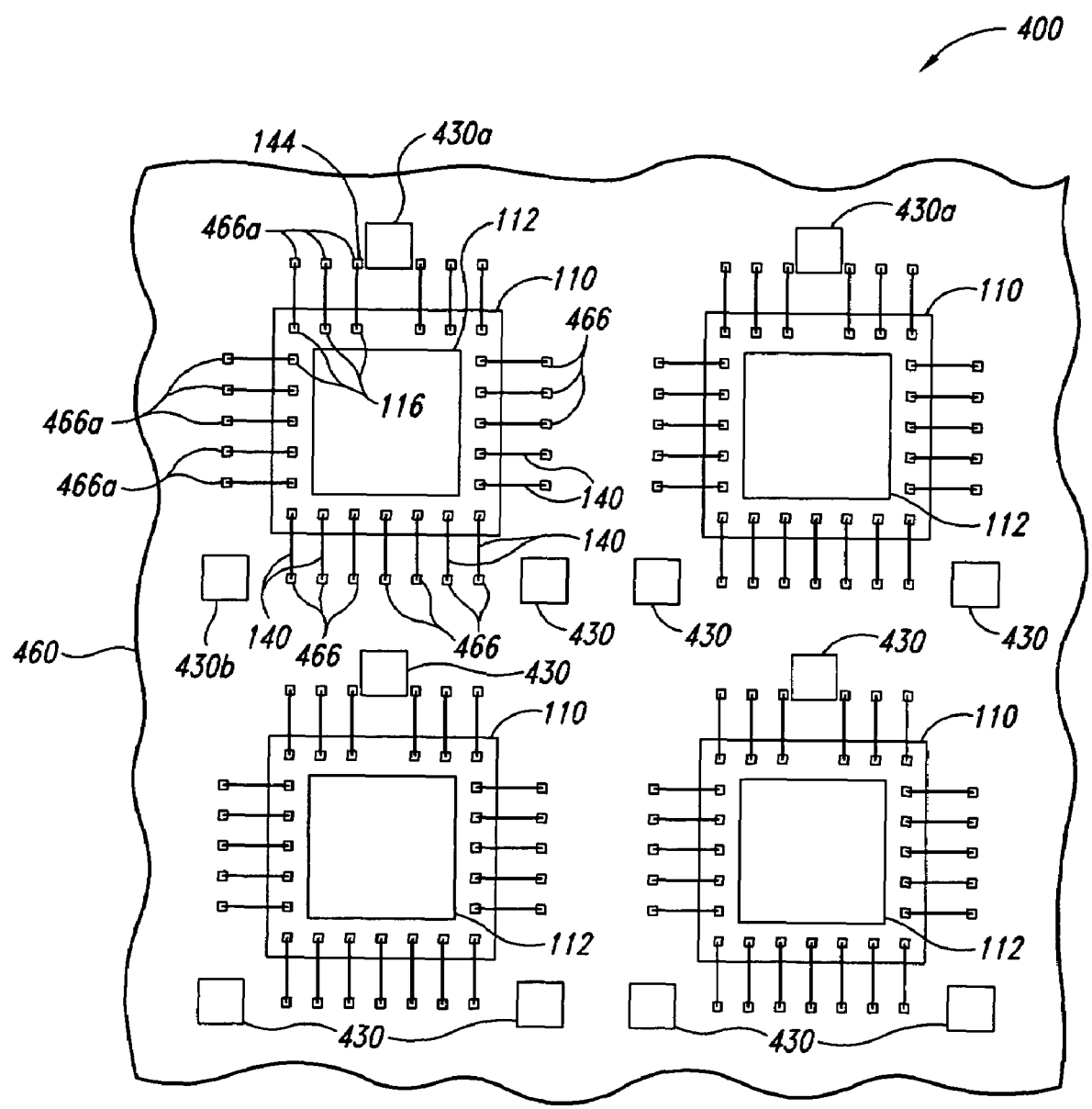
FIG. 8 is a schematic top plan view of an assembly including a plurality of imaging dies attached to a support member in accordance with another embodiment of the invention.

FIG. 8 is a schematic top plan view of an assembly 400 including a plurality of imaging dies 110 attached to a support member 460 in accordance with another embodiment of the invention. The assembly 400 is generally similar to the assembly 100 described above with reference to FIG. 3A. For example, the illustrated assembly 400 includes a plurality of stand-offs 430 arranged in arrays on the support member 460 around the perimeter of corresponding imaging dies 110. In the illustrated embodiment, however, each array includes three stand-offs 430 positioned in a generally triangular configuration. The stand-offs 430 are arranged so that terminals 466 on the support member 460 are positioned outboard and/or directly between adjacent stand-offs 430. For example, a first stand-off 430a and a second stand-off 430b are arranged such that a group of terminals 466a are positioned outboard the first and second stand-offs 430a-b. In additional embodiments, the stand-offs 430 can be arranged in arrays with other configurations for supporting the covers.

From the foregoing, it will be appreciated that specific embodiments of the invention have been described herein for purposes of illustration, but that various modifications may be made without deviating from the spirit and scope of the invention. For example, the microelectronic imaging units can have any combination of the features described above. Accordingly, the invention is not limited except as by the appended claims.

We claim:

1. A method of manufacturing a plurality of microelectronic imaging units, the method comprising:
   placing a plurality of singulated imaging dies on a support member, the individual imaging dies comprising an image sensor, an integrated circuit operably coupled to the image sensor, and a plurality of external contacts operably coupled to the integrated circuit;
   disposing at least three discrete spaced apart stand-offs on the support member so that adjacent standoffs define openings between them, the discrete stand-offs being arranged in arrays relative to corresponding imaging dies;
   electrically connecting the external contacts of the imaging dies to corresponding terminals on the support member; and
   attaching a plurality of covers to corresponding stand-off arrays so that the covers are positioned over the image sensors.

2. The method of claim 1 wherein;
   the stand-offs in the individual arrays are spaced apart so that adjacent stand-offs define openings between the covers and the support member; and
   the method further comprises flowing a material into the openings between the stand-offs.

3. The method of claim 1 wherein attaching the covers occurs after disposing the discrete stand-offs on the support member.

4. The method of claim 1 wherein electrically connecting the external contacts comprises wire-bonding the external contacts of the imaging dies to the corresponding terminals on the support member with one end of at least some of the wire-bonds being positioned outboard and/or directly between adjacent stand-offs.

5. The method of claim 1 wherein disposing the discrete stand-offs comprises arranging the stand-offs on the support member so that at least some of the terminals of the support member are positioned outboard and/or directly between adjacent stand-offs.

6. The method of claim 1 wherein:
   the individual imaging dies have four corners; and
   said step of disposing the stand-offs comprises constructing at least four stand-offs on the support member at the four corners of the imaging dies.

7. The method of claim 1 wherein disposing the stand-offs comprises constructing the stand-offs to have a predetermined height greater than a height of the imaging dies.

8. The method of claim 1 wherein disposing the stand-offs comprises dispensing epoxy onto the support member.

9. The method of claim 1 wherein disposing the stand-offs comprises constructing the stand-offs, using stereolithography.

10. The method of claim 1 wherein disposing the stand-offs comprises molding the stand-offs on the support member.

11. The method of claim 1 wherein the stand-offs are preformed, and wherein disposing the stand-offs comprises attaching the preformed stand-offs to the support member.

12. A method of manufacturing a plurality of microelectronic imaging units, the method comprising:
   providing a plurality of singulated imaging dies, the individual imaging dies comprising an image sensor, an integrated circuit operably coupled to the image sensor, and a plurality of external contacts operably coupled to the integrated circuit;
   coupling the singulated imaging dies to a support member;
   disposing at least three stand-offs on the support member, the individual stand-offs being arranged in arrays relative to corresponding imaging dies, the stand-offs in the individual arrays being spaced apart so that adjacent stand-offs define openings;
   electrically connecting the external contacts of the imaging dies to corresponding terminals on the support member;
   attaching a plurality of covers to the stand-offs with the covers over corresponding image sensors; and
   flowing a material into the openings between adjacent stand-offs.

13. The method of claim 12 wherein:
   the individual imaging dies comprise a first side having the image sensor, a second side attached to the support member, and a plurality of ends connecting the first side to the second side; and
   flowing the material comprises encapsulating the ends of the imaging dies.

14. The method of claim 12 wherein flowing the material comprises disposing the material across the image sensors of the imaging dies and filling a gap between the covers and the corresponding images sensors.

15. The method of claim 12 wherein flowing the material comprises disposing underfill material in the openings.

16. The method of claim 12 wherein flowing the material occurs after attaching the covers to the stand-offs.

17. The method of claim 12 wherein attaching the covers occurs after disposing the stand-offs on the support member.

18. The method of claim 12 wherein electrically connecting the external contacts comprises wire-bonding the external contacts of the imaging dies to the corresponding terminals on the support member with one end of at least some of the wire-bonds being-positioned outboard and/or directly between adjacent stand-offs.

19. The method of claim 12 wherein disposing the stand-offs comprises arranging the stand-offs on the support member so that at least some of the terminals on the support member are positioned outboard and/or directly between adjacent stand-offs.

20. A method of manufacturing a microelectronic imaging unit, the method comprising:
    coupling an imaging die to a support member having a plurality of terminals, the imaging die comprising an image sensor, an integrated circuit operably coupled to the image sensor, and a plurality of external contacts operably coupled to the integrated circuit;
    disposing a plurality of stand-offs on the support member with at least some of the terminals on the support member positioned outboard and/or directly between adjacent stand-offs;
    electrically connecting the external contacts of the imaging die to corresponding terminals on the support member; and
    attaching a cover to the stand-offs with the cover over the image sensor.

21. The method of claim 20 wherein:
    the stand-offs are spaced apart so that adjacent stand-offs define openings between the cover and the support member; and
    the method further comprises flowing a material into the openings between adjacent stand-offs.

22. The method of claim 20 wherein:
    the stand-offs are spaced apart so that adjacent stand-offs define openings between the cover and the support member; and
    the method further comprises flowing a material across the image sensor and filling a gap between the cover and the image sensor with the flowable material.

23. The method of claim 20 wherein:
    the imaging die comprises a first side having the image sensor, a second side attached to the support member, and a plurality of ends connecting the first side to the second side;
    the stand-offs are spaced apart so that adjacent stand-offs define openings between the cover and the support member; and
    the method further comprises encapsulating the ends of the imaging die.

24. The method of claim 20 wherein attaching the cover occurs after disposing the stand-offs on the support member.

25. The method of claim 20 wherein disposing the stand-offs comprises constructing at least four discrete stand-offs on the support member.

26. A method of manufacturing a microelectronic imaging unit, the method comprising:
    coupling an imaging die to a support member having a plurality of terminals, the imaging die comprising an image sensor, an integrated circuit operably coupled to the image sensor, and a plurality of external contacts operably coupled to the integrated circuit;
    disposing a plurality of stand-offs on the support member;
    wire-bonding the external contacts of the imaging die to corresponding terminals of the support member with one end of at least some of the wire-bonds being positioned outboard and/or directly between adjacent stand-offs; and
    attaching a cover to the stand-offs with the cover over the image sensor.

27. The method of claim 26 wherein:
    the stand-offs are spaced apart so that adjacent stand-offs define openings between the cover and the support member; and
    the method further comprises flowing a material into the openings between adjacent stand-offs.

28. The method of claim 26 wherein:
    the stand-offs are spaced apart so that adjacent stand-offs define openings between the cover and the support member; and
    the method further comprises flowing a material across the image sensor and filling a gap between the cover and the image sensor with the flowable material.

29. The method of claim 26 wherein:
    the imaging die comprises a first side having the image sensor, a second side attached to the support member, and a plurality of ends connecting the first side to the second side;
    the stand-offs are spaced apart so that adjacent stand-offs define openings between the cover and the support member; and the method further comprises encapsulating the ends of the imaging die.

30. The method of claim 26 wherein attaching the cover occurs after disposing the stand-offs on the support member.

31. The method of claim 26 wherein disposing the stand-offs comprises constructing at least four discrete stand-offs on the support member.

32. A method of manufacturing a microelectronic imaging unit, the method comprising:
    coupling an imaging die to a support member, the imaging die comprising an image sensor, an integrated circuit operably coupled to the image sensor, and a plurality of external contacts operably coupled to the integrated circuit;
    disposing at least three discrete spaced apart stand-offs on the support member such that said adjacent stand-offs define openings between them;
    electrically connecting the external contacts of the imaging die to corresponding terminals on the support member; and
    attaching a cover to the stand-offs with the cover over the image sensor.

33. The method of claim 32 wherein attaching the cover occurs after disposing the discrete stand-offs on the support member.

34. The method of claim 32 wherein disposing the stand-offs comprises constructing the stand-offs to have a predetermined height greater than a height of the imaging die.

35. A method of manufacturing a microelectronic imaging unit, the method comprising:
    coupling an imaging die to a support member, the imaging die comprising an image sensor, an integrated circuit operably coupled to the image sensor, and a plurality of external contacts operably coupled to the integrated circuit;
disposing a plurality of discrete stand-offs on the support member; and
attaching a cover to the stand-offs with the cover over the image sensor, wherein:
the stand-offs are spaced apart so that adjacent stand-offs define openings between the cover and the support member; and
the method further comprises flowing a material into the openings between adjacent stand-offs.

36. A method of manufacturing a microelectronic imaging unit, the method comprising:
coupling an imaging die to a support member, the imaging die comprising an image sensor, an integrated circuit operably coupled to the image sensor, and a plurality of external contacts operably coupled to the integrated circuit;
disposing a plurality of discrete stand-offs on the support member; and
electrically connecting the external contacts of the imaging die to corresponding terminals on the support member; wherein
electrically connecting the external contacts comprises wire-bonding the external contacts of the imaging die to the corresponding terminals on the support member with one end of at least some of the wire-bonds being positioned outboard and/or directly between adjacent stand-offs.

37. A method of manufacturing a microelectronic imaging unit, the method comprising:
coupling an imaging die to a support member, the imaging die comprising an image sensor, an integrated circuit operably coupled to the image sensor, and a plurality of external contacts operably coupled to the integrated circuit;
disposing a plurality of discrete stand-offs on the support member; and
electrically connecting the external contacts of the imaging die to corresponding terminals on the support member, wherein
disposing the discrete stand-offs comprises constructing the stand-offs on the support member so that at least some of the terminals of the support member are positioned outboard and/or directly between adjacent stand-offs.

38. A method of manufacturing a microelectronic imaging unit, the method comprising:
coupling an imaging die to a support member, the imaging die comprising an image sensor, an integrated circuit operably coupled to the image sensor, and a plurality of external contacts operably coupled to the integrated circuit;
disposing at least three stand-offs on the support member, the individual stand-offs being spaced apart so that adjacent stand-offs define openings;
electrically connecting the external contacts of the imaging die to corresponding terminals on the support member;
attaching a cover to the stand-offs with the cover over the image sensor; and
flowing a material into the openings between adjacent stand-offs.

39. The method of claim 38 wherein:
the imaging die comprises a first side having the image sensor, a second side attached to the support member, and a plurality of ends connecting the first side to the second side; and
flowing the material comprises encapsulating the ends of the imaging die.

40. The method of claim 38 wherein flowing the material comprises disposing the material across the image sensor of the imaging die and filling a gap between the cover and the image sensor with the flowable material.

41. The method of claim 38 wherein flowing the material comprises disposing underfill material in the openings between adjacent stand-offs.

42. The method of claim 38 wherein flowing the material occurs after attaching the cover to the stand-offs.

43. A method of manufacturing a microelectronic imaging unit, the method comprising:
coupling an imaging die to a support member, the imaging die comprising an image sensor, an integrated circuit operably coupled to the image sensor, and a plurality of external contacts operably coupled to the integrated circuit; and
disposing a plurality of discrete stand-offs on the support member, wherein the stand-offs are preformed, and wherein disposing the stand-offs comprises attaching the preformed stand-offs to the support member.

44. A method of manufacturing a microelectronic imaging unit, the method comprising:
coupling an imaging die to a support member, the imaging die comprising an image sensor;
disposing at least three discrete spaced apart stand-offs on the support member such that said adjacent stand-offs define openings between them; and
attaching a cover to the stand-offs with the cover over the image sensor.

* * * * *

UNITED STATES PATENT AND TRADEMARK OFFICE
CERTIFICATE OF CORRECTION

PATENT NO. : 7,416,913 B2 Page 1 of 1
APPLICATION NO. : 10/893022
DATED : August 26, 2008
INVENTOR(S) : Hall et al.

It is certified that error appears in the above-identified patent and that said Letters Patent is hereby corrected as shown below:

In column 8, line 4, in Claim 2, delete "wherein;" and insert -- wherein: --, therefor.

In column 8, line 35, in Claim 9, delete "stand-offs," and insert -- stand-offs --, therefor.

In column 9, line 15, in Claim 18, delete "being-positioned" and insert -- being positioned --, therefor.

Signed and Sealed this

Twenty-eighth Day of October, 2008

JON W. DUDAS
*Director of the United States Patent and Trademark Office*